(12) United States Patent
Kinoshita et al.

(10) Patent No.: US 11,121,247 B2
(45) Date of Patent: Sep. 14, 2021

(54) SEMICONDUCTOR DEVICE AND METHOD FOR MANUFACTURING SAME

(71) Applicants: Kabushiki Kaisha Toshiba, Tokyo (JP); Toshiba Electronic Devices & Storage Corporation, Tokyo (JP)

(72) Inventors: Tomoko Kinoshita, Kanagawa (JP); Daisuke Shinohara, Kanagawa (JP); Kanako Komatsu, Kanagawa (JP); Yoshiaki Ishii, Kanagawa (JP); Sudharsan Sundaram Prabhakaran, Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/571,666

(22) Filed: Sep. 16, 2019

(65) Prior Publication Data
US 2020/0303537 A1    Sep. 24, 2020

(30) Foreign Application Priority Data
Mar. 20, 2019 (JP) .............................. JP2019-053157

(51) Int. Cl.
*H01L 29/78* (2006.01)
*H01L 29/66* (2006.01)
*H01L 23/48* (2006.01)

(52) U.S. Cl.
CPC ........ *H01L 29/7801* (2013.01); *H01L 23/481* (2013.01); *H01L 29/66674* (2013.01)

(58) Field of Classification Search
None
See application file for complete search history.

(56) References Cited

U.S. PATENT DOCUMENTS

| 5,426,328 | A | 6/1995 | Yilmaz et al. |
| 5,559,044 | A | 9/1996 | Williams et al. |
| 6,373,453 | B1 * | 4/2002 | Yudasaka ............. G09G 3/3225 |
| | | | 315/169.3 |

(Continued)

FOREIGN PATENT DOCUMENTS

| JP | H08-227945 A | 9/1996 |
| JP | 2009-117670 A | 5/2009 |

(Continued)

*Primary Examiner* — Dale E Page
*Assistant Examiner* — Wilner Jean Baptiste
(74) *Attorney, Agent, or Firm* — White & Case LLP

(57) ABSTRACT

A semiconductor device includes a semiconductor portion, a first insulating film, a second insulating film, a first contact, a second contact, and a gate electrode. The first insulating film is provided on the semiconductor portion. The second insulating film is contacting the first insulating film, is provided on the semiconductor portion, and is thicker than the first insulating film. A through-hole is formed in the second insulating film. The first contact has a lower end connected to the semiconductor portion. The second contact has a lower portion disposed inside the through-hole and a lower end connected to the semiconductor portion. The gate electrode is positioned between the first contact and the second contact, is provided on the first insulating film, and is provided on a portion of the second insulating film other than the through-hole.

12 Claims, 13 Drawing Sheets

(56) References Cited

U.S. PATENT DOCUMENTS

| | | | |
|---|---|---|---|
| 2002/0017683 A1* | 2/2002 | Jeon | H01L 29/7816 257/339 |
| 2002/0109184 A1* | 8/2002 | Hower | H01L 29/66689 257/335 |
| 2002/0175392 A1* | 11/2002 | Jeon | H01L 29/7801 257/500 |
| 2005/0156234 A1* | 7/2005 | Gammel | H01L 29/41 257/335 |
| 2006/0148110 A1* | 7/2006 | Sung | H01L 29/66659 438/8 |
| 2007/0278568 A1* | 12/2007 | Williams | H01L 21/823493 257/335 |
| 2009/0114987 A1 | 5/2009 | Tanaka | |
| 2009/0159970 A1 | 6/2009 | Ichijo et al. | |
| 2009/0242981 A1* | 10/2009 | Fujita | H01L 29/0696 257/335 |
| 2015/0243777 A1 | 8/2015 | Fujii | |
| 2020/0058787 A1* | 2/2020 | Nguyen | H01L 29/0865 |

FOREIGN PATENT DOCUMENTS

| | | |
|---|---|---|
| JP | 2009-152371 A | 7/2009 |
| JP | 2015-162581 A | 9/2015 |
| WO | 2007142937 A2 | 12/2007 |

* cited by examiner

SEMICONDUCTOR DEVICE AND METHOD FOR MANUFACTURING SAME

CROSS-REFERENCE TO RELATED APPLICATIONS

This application is based upon and claims the benefit of priority from Japanese Patent Application No. 2019-053157, filed on Mar. 20, 2019; the entire contents of which are incorporated herein by reference.

FIELD

Embodiments relate to a semiconductor device and a method for manufacturing the same.

BACKGROUND

For example, a DMOS (Double-Diffused MOSFET) is used as a MOSFET (Metal-Oxide-Semiconductor Field-Effect Transistor) used in power control. It is desirable to increase the reliability and reduce the ON-resistance of the DMOS. An oxide film that is thicker than the gate oxide film is provided in the DMOS between the source and the drain to obtain a field plate effect. Considering downscaling and the manufacturing cost, STI (Shallow Trench Isolation; an insulating film for separating devices) is often used as the oxide film that is thicker than the gate oxide film.

DETAILED DESCRIPTION

Figure 1:
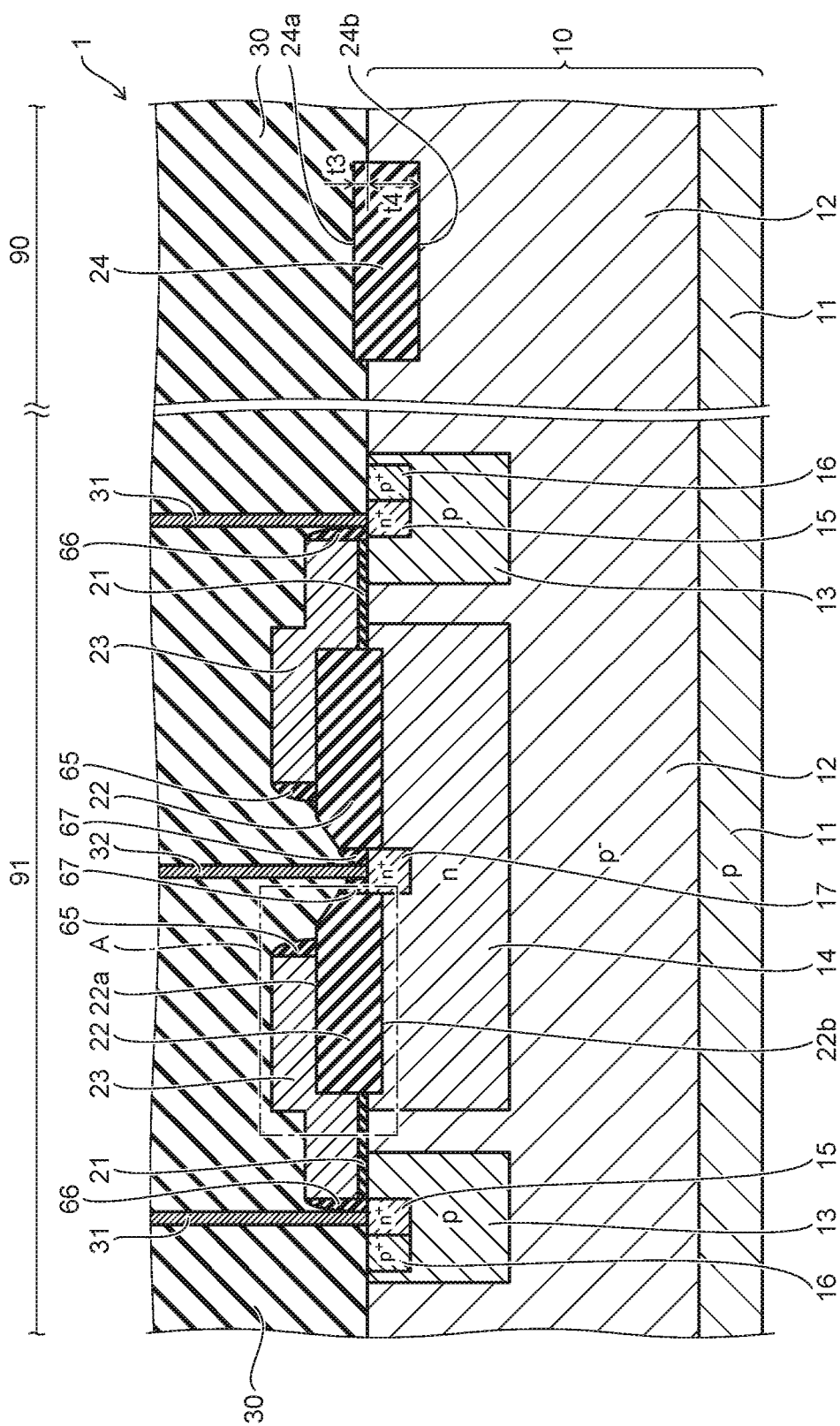
FIG. 1 is a cross-sectional view illustrating a semiconductor device according to a first embodiment.

In general, according to one embodiment, a semiconductor device includes a semiconductor portion, a first insulating film, a second insulating film, a first contact, a second contact, and a gate electrode. The first insulating film is provided on the semiconductor portion. The second insulating film is contacting the first insulating film, is provided on the semiconductor portion, and is thicker than the first insulating film. A through-hole is formed in the second insulating film. The first contact has a lower end connected to the semiconductor portion. The second contact has a lower portion disposed inside the through-hole and a lower end connected to the semiconductor portion. The gate electrode is positioned between the first contact and the second contact, is provided on the first insulating film, and is provided on a portion of the second insulating film other than the through-hole.

In general, according to one embodiment, a semiconductor device includes a semiconductor portion, a first insulating film, a second insulating film, and a gate electrode. The first insulating film is provided on the semiconductor portion. The second insulating film contacts the first insulating film, is provided on the semiconductor portion, and is thicker than the first insulating film. An angle between an upper surface of the second insulating film and a first side surface of the second insulating film is a right angle or an acute angle. The first side surface is at the first insulating film side of the second insulating film. An angle between the upper surface and a second side surface of the second insulating film is an obtuse angle. The second side surface is on a side of the second insulating film opposite to the first insulating film side. The gate electrode is provided on the first insulating film and on a portion of the second insulating film.

In general, according to one embodiment, a method is disclosed for manufacturing a semiconductor device. The method includes forming a first insulating film and a second insulating film on a semiconductor portion. The second insulating film contacts the first insulating film and is thicker than the first insulating film. The method includes forming a conductive film on the first insulating film and on the second insulating film. The method includes selectively removing the conductive film to form a gate electrode and a trench. The gate electrode covers a side surface of the second insulating film. The trench is in the conductive film. The method includes forming a through-hole in a portion of the second insulating film exposed at a bottom surface of the trench. The method includes forming a first contact and a second contact. The first contact is connected to the semiconductor portion outside the second insulating film. The second contact is connected to the semiconductor portion via the through-hole.

In general, according to one embodiment, a method is disclosed for manufacturing a semiconductor device. The method includes forming an insulating member and a second insulating film on a semiconductor portion. The second insulating film is made of a material different from the insulating member. The method includes forming a mask on the insulating member and on the second insulating film. The mask leaves exposed an end portion of the second insulating film and covers a portion of the second insulating film other than the end portion of the second insulating film. The method includes performing isotropic etching of the second insulating film using the mask. The method includes removing the mask and the insulating member. The method includes forming a first insulating film on the semiconductor portion. The first insulating film is thinner than the second insulating film. The method includes forming a gate electrode having a portion disposed on the first insulating film and another portion disposed on the second insulating film.

First Embodiment

First, a first embodiment will be described.

FIG. 1 is a cross-sectional view showing a semiconductor device according to the embodiment.

Figure 2:
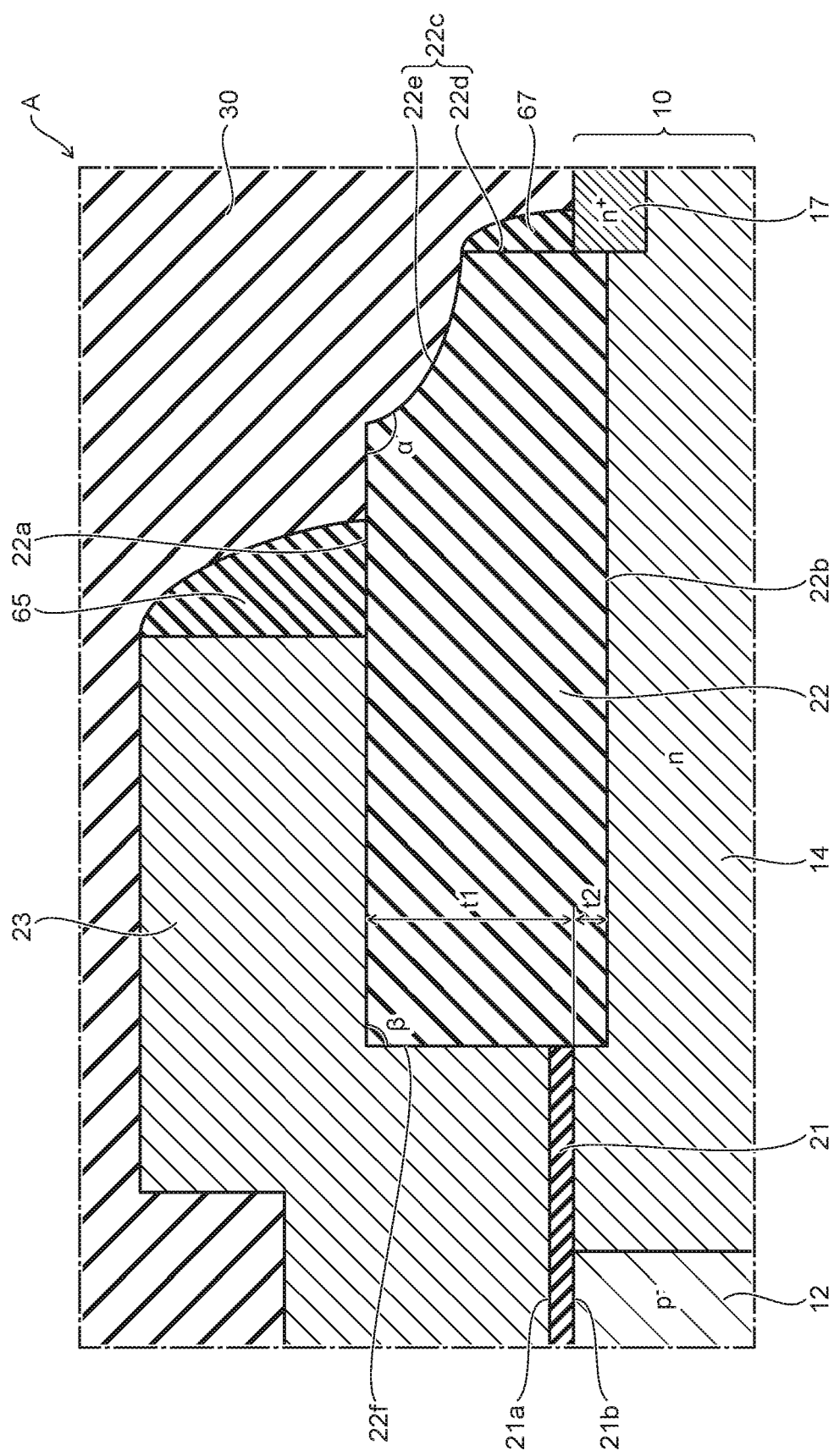
FIG. 2 is a partially enlarged cross-sectional view illustrating region A of FIG. 1.

FIG. 2 is a partially enlarged cross-sectional view showing region A of FIG. 1.

As shown in FIG. 1, a semiconductor substrate 10 is provided in the semiconductor device 1 according to the embodiment. The semiconductor substrate 10 includes a semiconductor material, e.g., silicon (Si) and is made of, for example, single-crystal silicon; and different types and concentrations of impurities are introduced to each component of the semiconductor substrate 10.

The internal structure of the semiconductor substrate 10 will now be described.

As described below, the semiconductor substrate 10 includes at least a p-type substrate 11, a p⁻-type epitaxial layer 12, a p-type well 13, an n-type drift layer 14, an n⁺-type source layer 15, a p⁺-type contact layer 16, and an n⁺-type drain layer 17.

The p-type substrate 11 of the p-conductivity type is provided in the semiconductor substrate 10. The p⁻-type epitaxial layer 12 of the p⁻-conductivity type is provided on the p-type substrate 11. The p-type well 13 of the p-conductivity type and the n-type drift layer 14 of the n-conductivity type are provided to be separated from each other in a portion on the p⁻-type epitaxial layer 12. A portion of the p⁻-type epitaxial layer 12 is interposed between the p-type well 13 and the n-type drift layer 14. The p-type well 13 and the n-type drift layer 14 may be arranged alternately along one direction parallel to the upper surface of the p-type substrate 11.

The n⁺-type source layer 15 of the n⁺-conductivity type and the p⁺-type contact layer 16 of the p⁺-conductivity type are provided in portions on the p-type well 13. The n⁺-type source layer 15 and the p⁺-type contact layer 16 contact each other. The n⁺-type source layer 15 and the p⁺-type contact layer 16 are separated from the p⁻-type epitaxial layer 12. The impurity concentration of the n⁺-type source layer 15 is higher than the impurity concentration of the n-type drift layer 14. The impurity concentration of the p⁺-type contact layer 16 is higher than the impurity concentration of the p-type well 13. The n⁺-type drain layer 17 of the n⁺-conductivity type is provided in a portion on the n-type drift layer 14. The impurity concentration of the n⁺-type drain layer 17 is higher than the impurity concentration of the n-type drift layer 14. In the specification, the "impurity concentration" refers to the concentration of the impurities contributing to the conductivity of the semiconductor material, and in the case where both an impurity that forms donors and an impurity that forms acceptors are included, refers to the effective concentration excluding the cancelled portion of the donors and the acceptors.

The structure on the semiconductor substrate 10 will now be described.

A gate insulating film 21 is provided on the semiconductor substrate 10. The gate insulating film 21 is formed of, for example, silicon oxide. The gate insulating film 21 is disposed in a region directly above the portion of the n-type drift layer 14 on the p-type well 13 side, a region directly above the portion of the p⁻-type epitaxial layer 12 between the n-type drift layer 14 and the p-type well 13, and a region directly above the portion of the p-type well 13 between the p⁻-type epitaxial layer 12 and the n⁺-type source layer 15.

An insulating film 22 is provided on the semiconductor substrate 10. The insulating film 22 is formed of, for example, silicon oxide. The insulating film 22 is disposed in a region directly above a portion of the n-type drift layer 14 and contacts the gate insulating film 21. When viewed from above, the gate insulating film 21 is disposed between the n⁺-type source layer 15 and the insulating film 22; and the insulating film 22 is disposed between the gate insulating film 21 and the n⁺-type drain layer 17.

As shown in FIG. 2, the insulating film 22 is thicker than the gate insulating film 21. An upper surface 22a of the insulating film 22 is positioned higher than an upper surface 21a of the gate insulating film 21; and a lower surface 22b of the insulating film 22 is positioned lower than a lower surface 21b of the gate insulating film 21. A thickness t1 of the portion of the insulating film 22 disposed higher than the semiconductor substrate 10 is thicker than a thickness t2 of the portion of the insulating film 22 disposed inside the semiconductor substrate 10. In other words, t1>t2. The thickness t2 may be zero or may be, for example, several nm to several tens of nm.

A side surface 22c of the insulating film 22 on the n⁺-type drain layer 17 side, that is, on the side opposite to the gate insulating film 21 side, includes a lower portion 22d and an upper portion 22e. The lower portion 22d is a vertical surface substantially orthogonal to the upper surface of the semiconductor substrate 10; and the upper portion 22e is a tilted surface that tilts upward toward the n⁺-type source layer 15. The upper portion 22e is curved to be concave. Therefore, an angle α between the upper surface 22a of the insulating film 22 and the side surface 22c of the insulating film 22 on the n⁺-type drain layer 17 side is an obtuse angle.

On the other hand, although the upper surface 22a of the insulating film 22 is substantially horizontal, there are cases where the upper surface 22a is tilted upward toward the n⁺-type source layer 15 side, that is, toward the end portion on the gate insulating film 21 side. Therefore, an angle β between the upper surface 22a of the insulating film 22 and a side surface 22f of the insulating film 22 on the n⁺-type source layer 15 side is a right angle or an acute angle. Accordingly, α>β.

The upper surface 22a of the insulating film 22 is substantially parallel to the lower surface 22b of the insulating film 22. The upper surface 22a is shorter than the lower surface 22b in the direction from the gate insulating film 21 to the insulating film 22. The side surfaces 22c and 22f are surfaces that connect the upper surface 22a and the lower surface 22b respectively. As described above, the side surface 22c has two surfaces, that is, the lower portion 22d and the upper portion 22e. The lower portion 22d is connected to the lower surface 22b, and the upper portion 22e is connected to the upper surface 22a. The side surface 22c may have three or more surfaces.

As shown in FIG. 1, a gate electrode 23 is provided on the gate insulating film 21 and on the insulating film 22. The gate electrode 23 is made of a conductive material and is made of, for example, polysilicon including an impurity. The portion of the gate electrode 23 on the n⁺-type source layer 15 side is disposed on the gate insulating film 21; and the portion of the gate electrode 23 on the n⁺-type drain layer 17 side is disposed on the insulating film 22.

A DMOS is formed of the portions of the semiconductor substrate 10, the gate insulating film 21, the insulating film 22, and the gate electrode 23. Hereinbelow, the region of the semiconductor device 1 where the DMOS is formed is called a "region 91." A device or a circuit other than the DMOS may be formed in the semiconductor device 1. In the embodiment, for example, a logic circuit is formed. The region of the semiconductor device 1 other than the region 91 is called a "region 90." A logic circuit, STI, etc., are formed in the region 90. Although the logic circuit is described as an example of a structural component other than the DMOS in the semiconductor device 1, a logic circuit is not necessarily provided in the semiconductor device 1.

STI (Shallow Trench Isolation; an insulating film for separating devices) 24 is provided in the semiconductor device 1. The STI 24 may be disposed to surround the region 91. Also, the STI 24 may be disposed in the region 90 to be separated from the region 91. In the embodiment, the STI 24 is disposed in the region 90.

The STI 24 is made of, for example, silicon oxide and is thicker than the gate insulating film 21. At least the lower portion of the STI 24 is disposed inside the semiconductor substrate 10. A thickness t3 of the portion of the STI 24 disposed higher than the semiconductor substrate 10 is thinner than a thickness t4 of the portion of the STI 24 disposed inside the semiconductor substrate 10. In other words, t3<t4. The thickness t3 may be zero or may be, for example, several nm to several tens of nm. An upper surface 24a of the STI 24 is positioned lower than the upper surface 22a of the insulating film 22; and a lower surface 24b of the STI 24 is positioned lower than the lower surface 22b of the insulating film 22.

An inter-layer insulating film 30 is provided on the semiconductor substrate 10, the gate insulating film 21, the insulating film 22, the gate electrode 23, and the STI 24. A source contact 31, a drain contact 32, and a gate contact (not illustrated) are provided inside the inter-layer insulating film 30. The lower end of the source contact 31 is connected to the $n^+$-type source layer 15 of the semiconductor substrate 10. The lower end of the drain contact 32 is connected to the $n^+$-type drain layer 17 of the semiconductor substrate 10. The lower end of the gate contact is connected to the gate electrode 23.

A method for manufacturing the semiconductor device according to the embodiment will now be described.

FIG. 3A to FIG. 6B are cross-sectional views showing the method for manufacturing the semiconductor device according to the embodiment.

In the description hereinbelow, the region where the DMOS is to be formed (the region 91) and the region where the logic circuit is to be formed (the region 90) will be described.

Figure 3A:
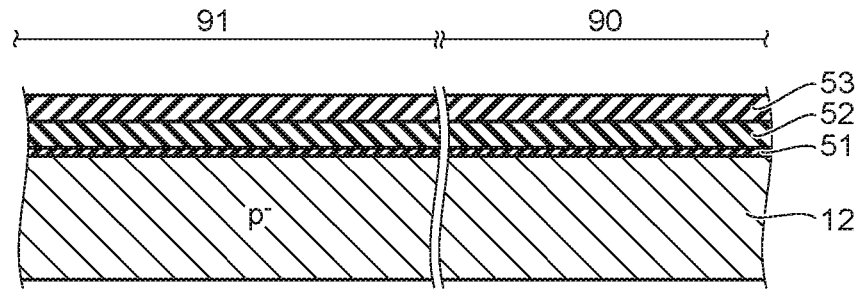
FIG. 3A to FIG. 6B are cross-sectional views illustrating a method for manufacturing the semiconductor device according to the first embodiment.

First, as shown in FIG. 3A, the semiconductor substrate 10 is prepared by forming the $p^-$-type epitaxial layer 12 by epitaxially growing silicon on the p-type substrate 11 (referring to FIG. 1). Then, a silicon oxide layer 51 is formed at the upper surface of the p-type epitaxial layer 12 by performing thermal oxidation treatment. Then, a silicon nitride film 52 is formed on the silicon oxide layer 51. Then, a silicon oxide film 53 is formed.

Figure 3B:
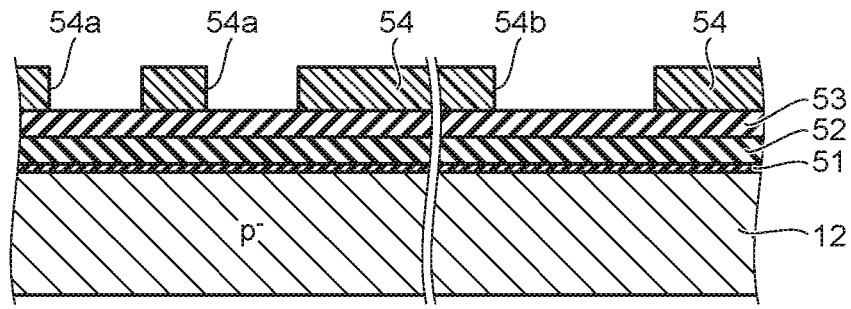
Figure 3C:
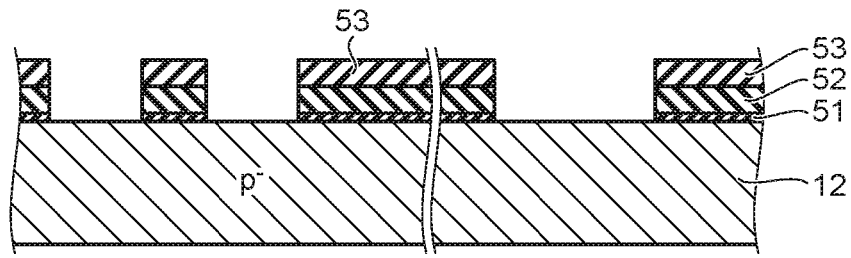

Continuing as shown in FIG. 3B, a resist pattern 54 is formed on the silicon oxide film 53 by lithography. Openings 54a and 54b are formed in the resist pattern 54. Then, as shown in FIG. 3C, etching such as RIE (Reactive Ion Etching) or the like is performed using the resist pattern 54 as a mask. Thereby, the portions of the silicon oxide film 53, the silicon nitride film 52, and the silicon oxide layer 51 disposed in the regions directly under the openings 54a and 54b are removed.

Figure 3D:
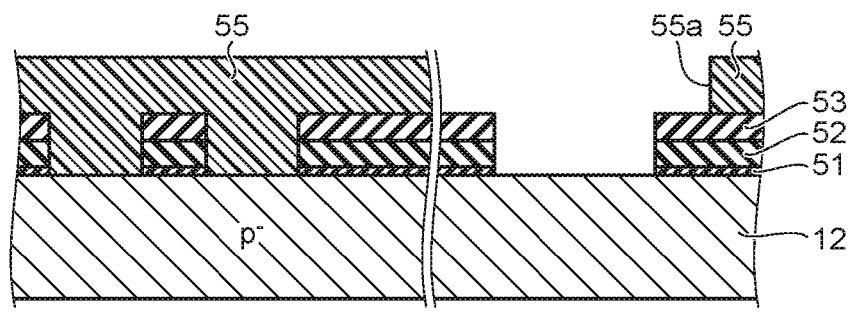

Then, as shown in FIG. 3D, a resist pattern 55 is formed by lithography. An opening 55a is formed in the resist pattern 55 in the region 90.

Figure 4A:
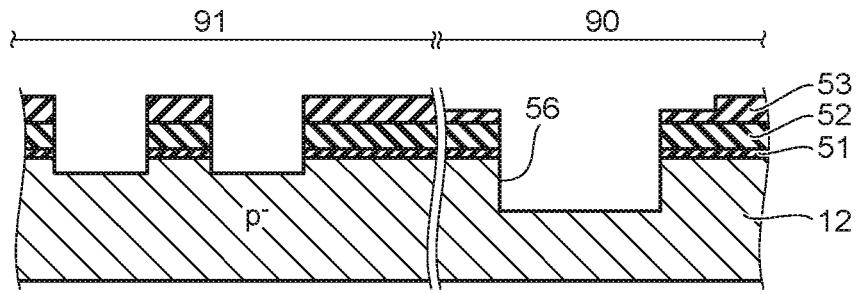

Continuing as shown in FIG. 4A, etching such as RIE or the like is performed using the resist pattern 55 as a mask. Thereby, a recess 56 is formed in the upper surface of the $p^-$-type epitaxial layer 12. At this time, the upper layer portion of the silicon oxide film 53 also is removed in the region directly under the opening 55a. Then, the resist pattern 55 is removed.

Figure 4B:
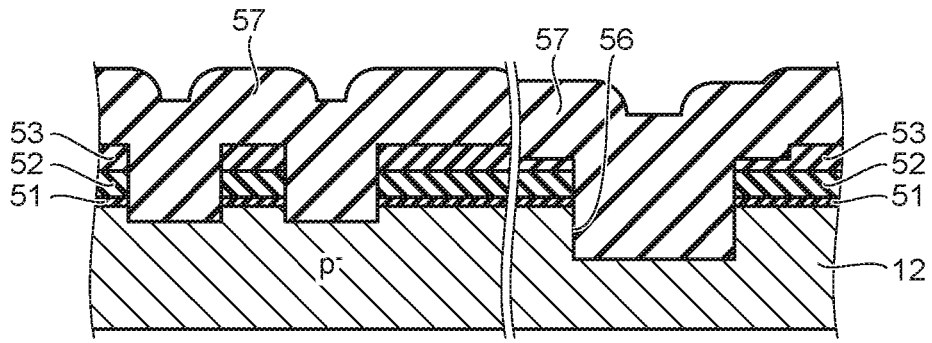

Continuing as shown in FIG. 4B, a silicon oxide film 57 is formed by CVD using TEOS as a source material. The silicon oxide film 57 is formed to cover both the region 91 and the region 90. The silicon oxide film 57 is thick enough to completely fill the recess 56.

Figure 4C:
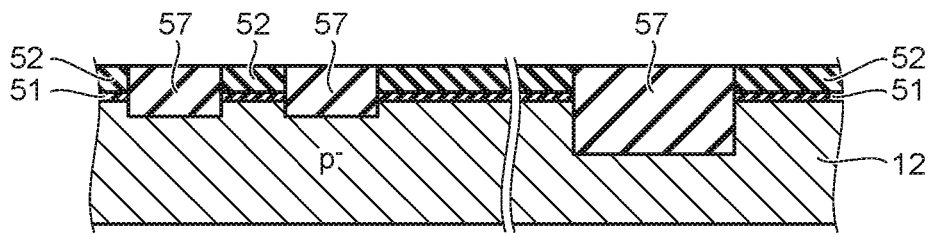

Then, as shown in FIG. 4C, planarization such as CMP (Chemical Mechanical Polishing) or the like is performed using the silicon nitride film 52 as a stopper. Thereby, the silicon oxide film 53 and a portion of the silicon oxide film 57 are removed; and the silicon nitride film 52 is exposed.

Figure 4D:
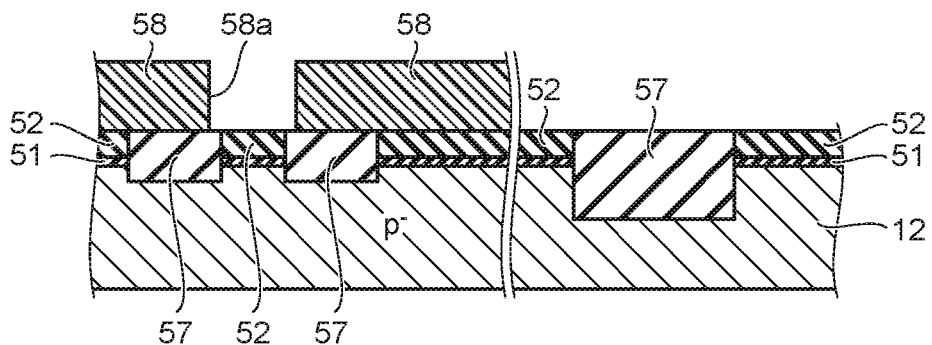

Continuing as shown in FIG. 4D, a resist pattern 58 is formed in the region 91 by lithography. An opening 58a is formed in the resist pattern 58 in the region where the end portion of the insulating film 22 on the $n^+$-type drain layer 17 side is to be formed. The silicon nitride film 52 and the silicon oxide film 57 are exposed at the bottom surface of the opening 58a. The resist pattern 58 leaves the end portion of the silicon oxide film 57 exposed and covers the portion of the silicon oxide film 57 other than the end portion.

Figure 5A:
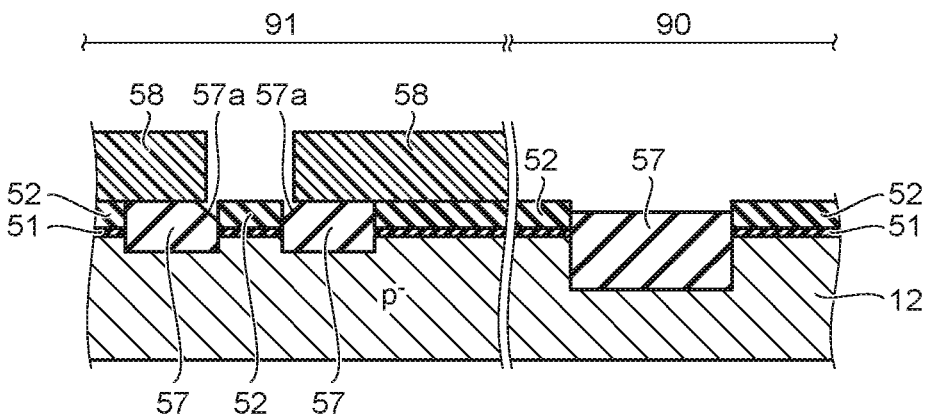

Then, as shown in FIG. 5A, isotropic etching such as wet etching or the like of silicon oxide is performed using the resist pattern 58 as a mask. Thereby, the silicon oxide film 57 is etched from the starting point of the portion of the silicon oxide film 57 exposed inside the opening 58a of the resist pattern 58. As a result, a concave curved surface 57a is formed in the silicon oxide film 57. The curved surface 57a is tilted with respect to the horizontal surface and the vertical surface. At this time, in the region 90 as well, the upper layer portion of the silicon oxide film 57 remaining inside the recess 56 is removed. As a result, the upper surface 24a of the STI 24 is lower than the upper surface 22a of the insulating film 22 in the processes described below.

Figure 5B:
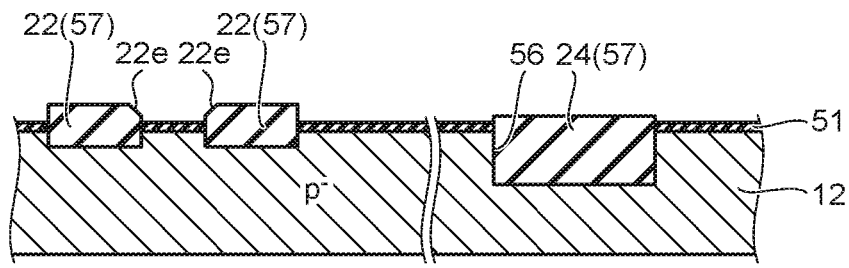

Continuing as shown in FIG. 5B, the resist pattern 58 and the silicon nitride film 52 are removed. As a result, the upper portion of the silicon oxide film 57 protrudes from the upper surface of the $p^-$-type epitaxial layer 12. Thereby, the silicon oxide film 57 that remains in the region 91 becomes the insulating film 22; and the curved surface 57a becomes the upper portion 22e of the side surface 22c of the insulating film 22. Also, the silicon oxide film 57 that remains inside the recess 56 in the region 90 becomes the STI 24.

Figure 5C:
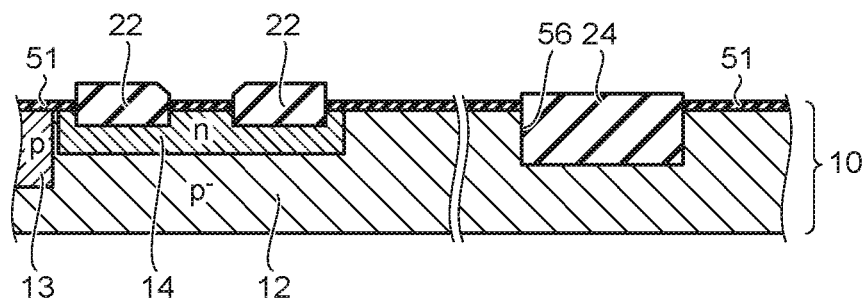

Then, as shown in FIG. 5C, impurities are ion-implanted selectively into the upper layer portion of the $p^-$-type epitaxial layer 12 directly and via the insulating film 22. The n-type drift layer 14 and the p-type well 13 are formed thereby.

Figure 5D:
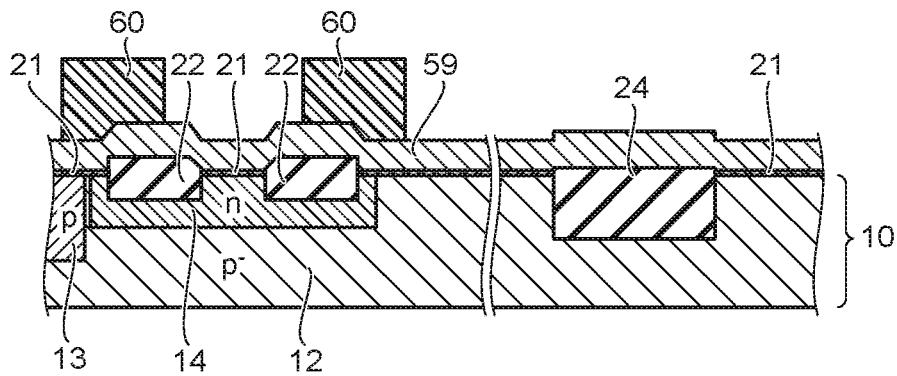

Continuing as shown in FIG. 5D, a silicon oxide layer is removed from the front surface of the semiconductor substrate 10. Then, the gate insulating film 21 is formed at the exposed portion of the semiconductor substrate 10 by performing thermal oxidation treatment. Then, a polysilicon film 59 is formed on the gate insulating film 21, on the insulating film 22, and on the STI 24 by depositing polysilicon. Then, a resist pattern 60 is formed on the polysilicon film 59 by lithography. The resist pattern 60 is disposed in the region where the gate electrode 23 is to be formed.

Figure 6A:
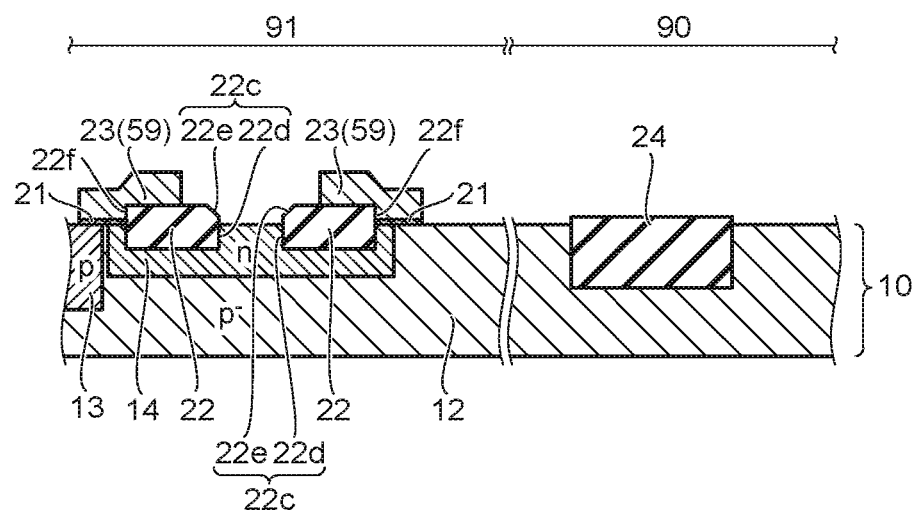

Continuing as shown in FIG. 6A, the polysilicon film 59 is patterned by performing etching such as RIE or the like using the resist pattern 60 as a mask. The gate electrode 23 is formed thereby. The portion of the gate electrode 23 on the source side is disposed on the gate insulating film 21; and the portion of the gate electrode 23 on the drain side is disposed on the insulating film 22. In the conventional structure, since the corner of the insulating film 22 has an acute angle, the polysilicon film 59 is likely to remain at the corners of the insulating film 22 when the polysilicon film 59 is processed. The residue of the polysilicon film 59 causes a defect such as a leak current. In the embodiment, the polysilicon film 59 does not remain easily on the side surface 22c because the upper portion 22e of the side surface 22c of the insulating film 22 not covered with the resist pattern 60 is tilted with respect to the vertical surface.

Figure 6B:
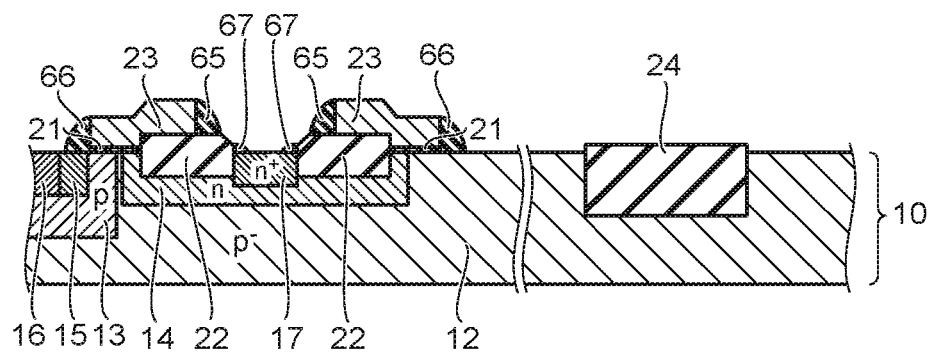

Then, as shown in FIG. 6B, an insulating material is deposited on the entire surface; and etch-back is performed. Thereby, a sidewall 65 is formed on the side surface of the gate electrode 23 on the drain side; a sidewall 66 is formed on the side surface of the gate electrode 23 on the source side; and a sidewall 67 is formed on the side surface 22c of the insulating film 22 not covered with the gate electrode 23. Then, the n+-type source layer 15, the n+-type drain layer 17, and the p+-type contact layer 16 are formed by selectively ion-implanting impurities. Thus, the DMOS is formed.

Continuing as shown in FIG. 1, for example, the inter-layer insulating film 30 is formed on the entire surface by depositing silicon oxide by CVD using TEOS as a source material. Then, contact holes are formed in the inter-layer insulating film 30; and the source contact 31 and the drain contact 32 are formed. At this time, the source contact 31 reaches the region between the sidewalls 66; and the drain contact 32 reaches the region between the sidewalls 67. Thus, the semiconductor device 1 according to the embodiment is manufactured.

Effects of the embodiment will now be described.

In the embodiment, the insulating film 22 that is thicker than the gate insulating film 21 is provided on the semiconductor substrate 10; and the portion of the gate electrode 23 on the drain side is disposed on the insulating film 22. Thereby, electric field concentration between the n+-type source layer 15 and the n+-type drain layer 17 is relaxed; and the breakdown voltage of the DMOS increases.

The insulating film 22 is disposed substantially on the semiconductor substrate 10; and the thickness t1 of the portion of the insulating film 22 disposed higher than the semiconductor substrate 10 is thicker than the thickness t2 of the portion of the insulating film 22 disposed inside the semiconductor substrate 10. Therefore, the current flowing from the n+-type drain layer 17 to the n+-type source layer 15 that is blocked by the insulating film 22 is low; and the ON-resistance of the DMOS is low. Further, because the thickness t2 is thin, an electric field does not concentrate easily at the corner of the insulating film 22 inside the semiconductor substrate 10. Therefore, HCI (Hot Carrier Injection) does not occur easily; and the reliability of the DMOS is high.

In the embodiment, the resist pattern 58 is formed in the process shown in FIG. 4D; but the opening 58a is formed in the resist pattern 58. The opening 58a is positioned in the region where the end portion of the insulating film 22 on the n+-type drain layer 17 side is to be formed. Then, in the process shown in FIG. 5A, wet etching of silicon oxide is performed using the resist pattern 58 as a mask. As a result, the concave curved surface 57a is formed in the silicon oxide film 57, which becomes the upper portion 22e of the side surface 22c of the insulating film 22 in the process shown in FIG. 5B.

Thereby, in the process shown in FIG. 6A, the polysilicon film 59 does not remain easily on the side surface 22c of the insulating film 22 when forming the gate electrode 23 by patterning the polysilicon film 59. As a result, in the process shown in FIG. 1, the position of the drain contact 32 can be controlled with high precision when forming the drain contact 32.

MODIFICATION OF FIRST EMBODIMENT

A modification of the first embodiment will now be described.

Figure 7A:
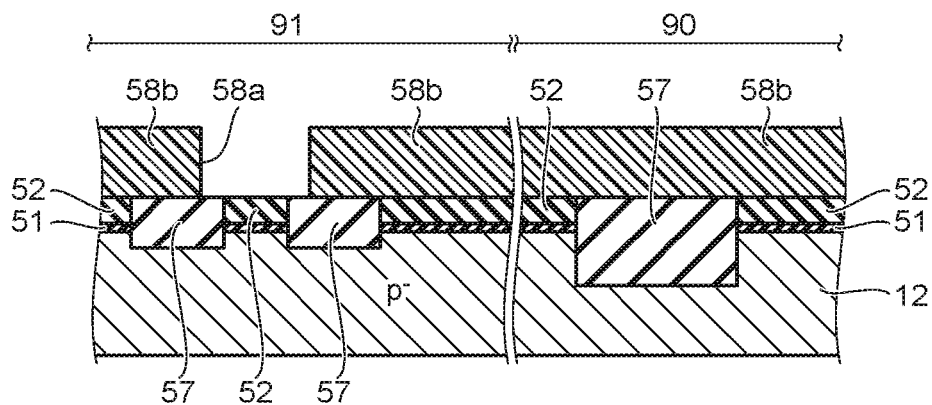
FIG. 7A to FIG. 7C are cross-sectional views illustrating a method for manufacturing a semiconductor device according to a modification of the first embodiment.
Figure 7B:
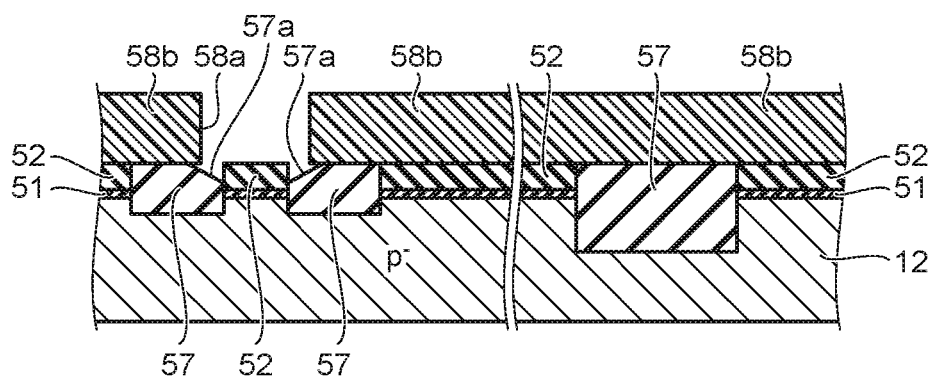
Figure 7C:
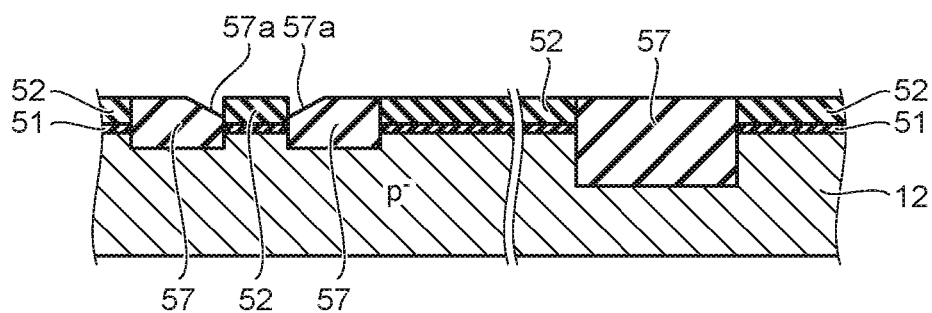

FIG. 7A to FIG. 7C are cross-sectional views showing a method for manufacturing a semiconductor device according to the modification.

First, the processes shown in FIG. 3A to FIG. 4C are performed.

Then, as shown in FIG. 7A, a resist pattern 58b is formed by lithography. Unlike the resist pattern 58 of the first embodiment (referring to FIG. 4D), the resist pattern 58b is formed also in the region 90 in addition to the region 91. For example, the resist pattern 58b is formed on the entire surface of the semiconductor substrate 10. Similarly to the resist pattern 58, the opening 58a is formed in the resist pattern 58b in the region where the end portion of the insulating film 22 on the n+-type drain layer 17 side is to be formed.

Continuing as shown in FIG. 7B, wet etching of silicon oxide is performed using the resist pattern 58b as a mask. Thereby, the concave curved surface 57a is formed in the silicon oxide film 57. At this time, the silicon oxide film 57 in the region 90 is not etched. Therefore, in the process shown in FIG. 5B, the upper surface 24a of the STI 24 is at substantially the same height as the upper surface 22a of the insulating film 22.

Then, the resist pattern 58b is removed as shown in FIG. 7C.

Continuing, the processes shown in FIG. 5B to FIG. 6B are performed.

According to the modification as well, a semiconductor device similar to that of the first embodiment can be manufactured. However, the modification differs from the first embodiment in that the upper surface 24a of the STI 24 is at substantially the same height as the upper surface 22a of the insulating film 22.

Otherwise, the configuration, the manufacturing method, and the effects of the modification are similar to those of the first embodiment.

Second Embodiment

A second embodiment will now be described.

Figure 8:
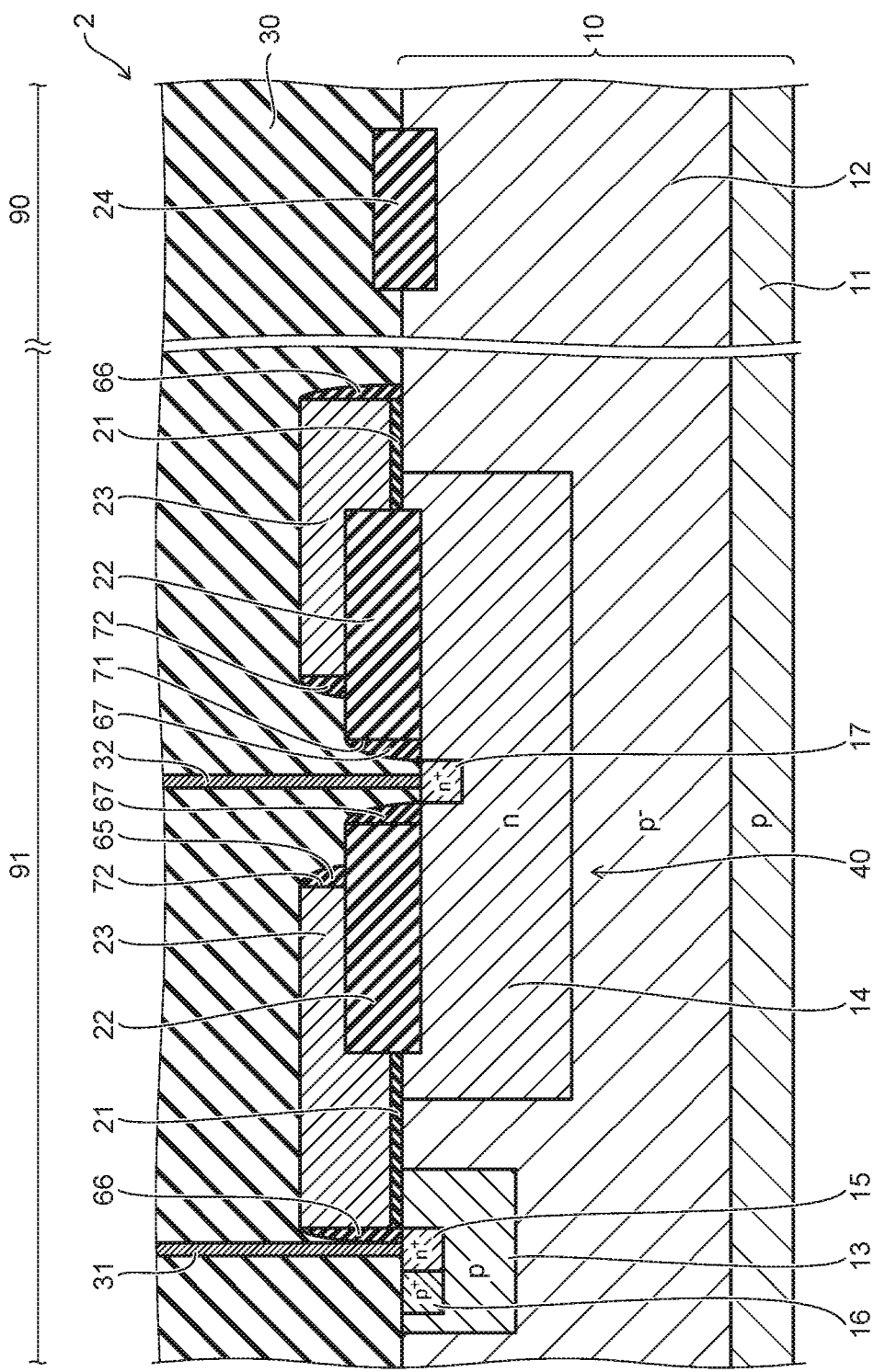
FIG. 8 is a cross-sectional view illustrating a semiconductor device according to a second embodiment.

FIG. 8 is a cross-sectional view showing a semiconductor device according to the embodiment.

As shown in FIG. 8, the semiconductor device 2 according to the embodiment differs from the semiconductor device 1 according to the first embodiment (referring to FIG. 1 and FIG. 2) in that a through-hole 71 is formed in the portion of the insulating film 22 corresponding to the region directly above the n+-type drain layer 17; and the drain contact 32 is connected to the n+-type drain layer 17 via the through-hole 71. In other words, the lower portion of the drain contact 32 is disposed inside the through-hole 71 of the insulating film 22. The gate electrode 23 is disposed on the gate insulating film 21 and on the portion of the insulating film 22 other than the through-hole 71. The sidewall 65 is provided on the side surface of the gate electrode 23 on the drain side; the sidewall 66 is provided on the side surface of the gate electrode 23 on the source side; and the sidewall 67 is provided on the side surface of the through-hole 71, that is, on the inner surface of the insulating film 22. The semiconductor device 2 differs from the semiconductor device 1 in that the relationships of the angles α and p described above are not particularly limited. In other words, the angles between the upper surface and the side surfaces of the insulating film 22 are arbitrary.

A method for manufacturing the semiconductor device according to the embodiment will now be described.

FIG. 9 to FIG. 13 are cross-sectional views showing the method for manufacturing the semiconductor device according to the embodiment.

Figure 9:
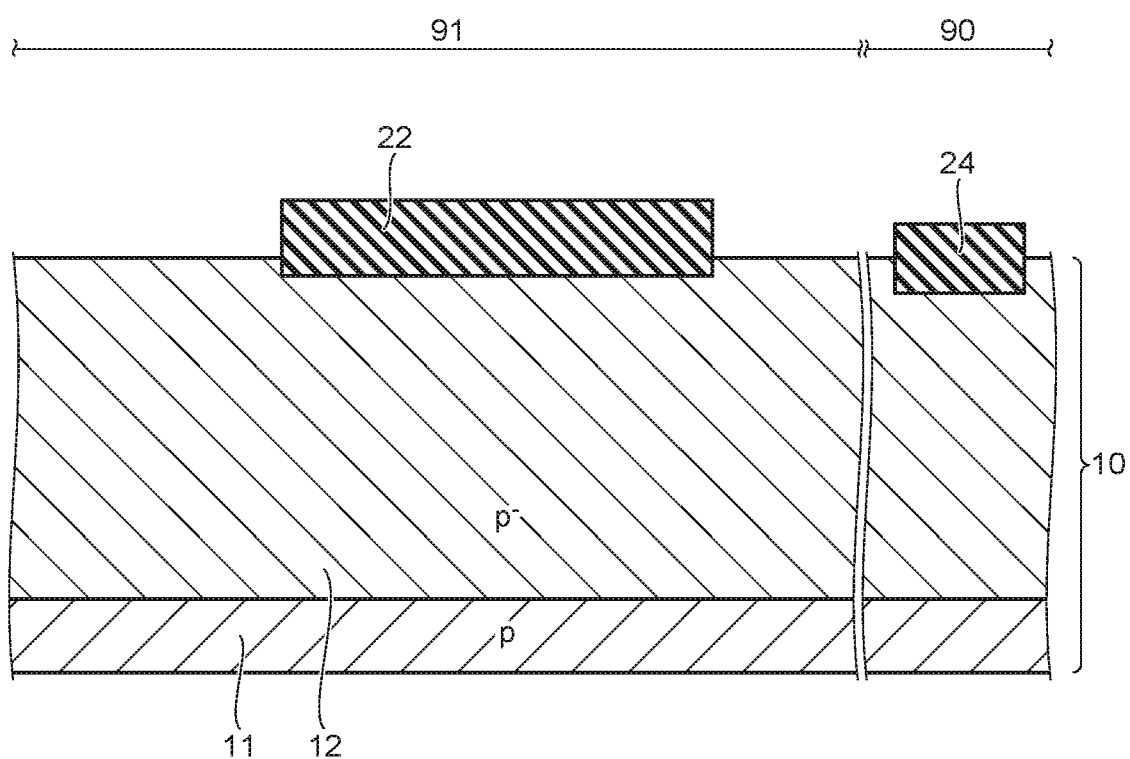
FIG. 9 to FIG. 13 are cross-sectional views illustrating a method for manufacturing the semiconductor device according to the second embodiment.

First, the processes shown in FIG. 3A to FIG. 4C are performed. Then, as shown in FIG. 9, the silicon nitride film 52 is removed by wet etching. Thereby, the insulating film 22 and the STI 24 are formed on the semiconductor substrate 10.

Figure 10:
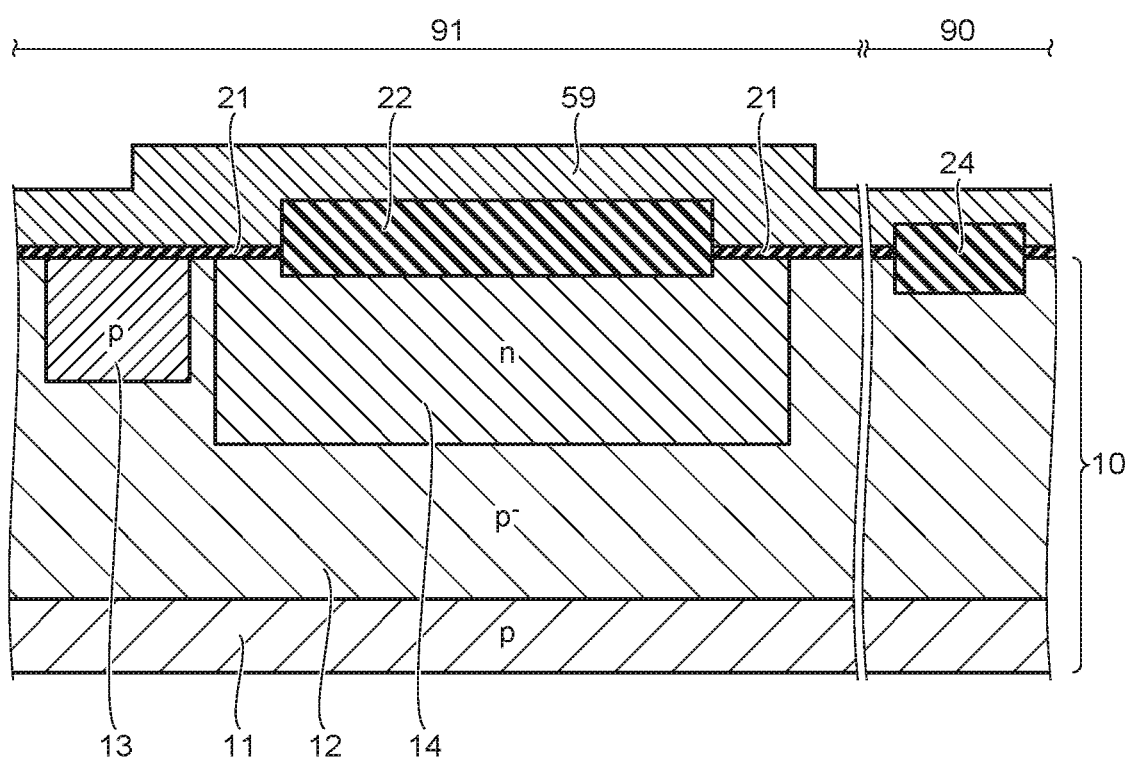

Continuing as shown in FIG. 10, the p-type well 13 and the n-type drift layer 14 are formed by selectively ion-implanting impurities. Then, the gate insulating film 21 is formed on the exposed surface of the semiconductor substrate 10 by performing thermal oxidation treatment. Then, the conductive polysilicon film 59 is formed on the gate insulating film 21, on the insulating film 22, and on the STI 24 by depositing polysilicon.

Figure 11:
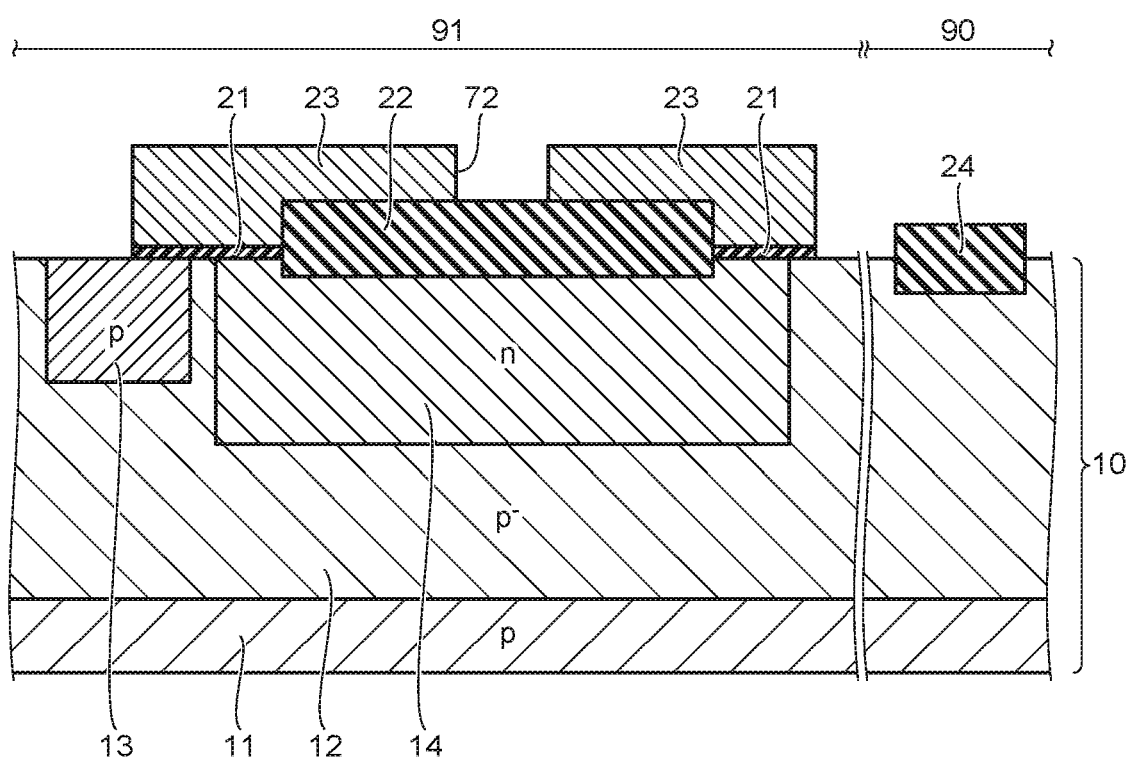

Continuing as shown in FIG. 11, the gate electrode 23 is formed by selectively removing the polysilicon film 59 by lithography and RIE. At this time, the end edge of the gate electrode 23 is disposed outside the insulating film 22 when viewed from above. Thereby, the entire side surface of the insulating film 22 is covered with the gate electrode 23. Also, a trench 72 is formed in the portion of the polysilicon film 59 positioned on the insulating film 22. The insulating film 22 is exposed at the bottom surface of the trench 72. For example, the trench 72 extends in a direction perpendicular to the page surface of FIG. 11. Thereby, the two mutually-separated gate electrodes 23 are formed in the region shown in FIG. 11.

Figure 12:
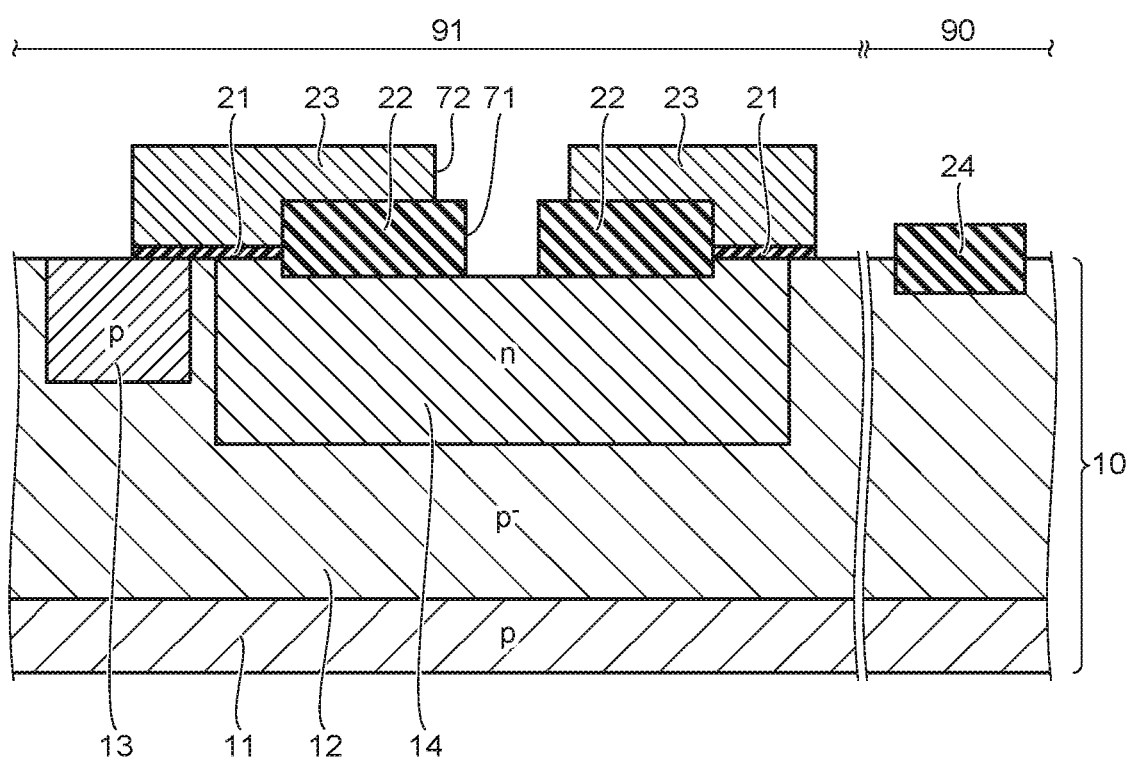

Then, as shown in FIG. 12, the through-hole 71 is formed in the portion of the insulating film 22 exposed at the bottom surface of the trench 72. The n-type drift layer 14 is exposed at the bottom surface of the through-hole 71. The configuration of the through-hole 71 when viewed from above may be a hole configuration such as a circle, a rectangle, etc., or may be a trench configuration extending along the trench 72.

Figure 13:
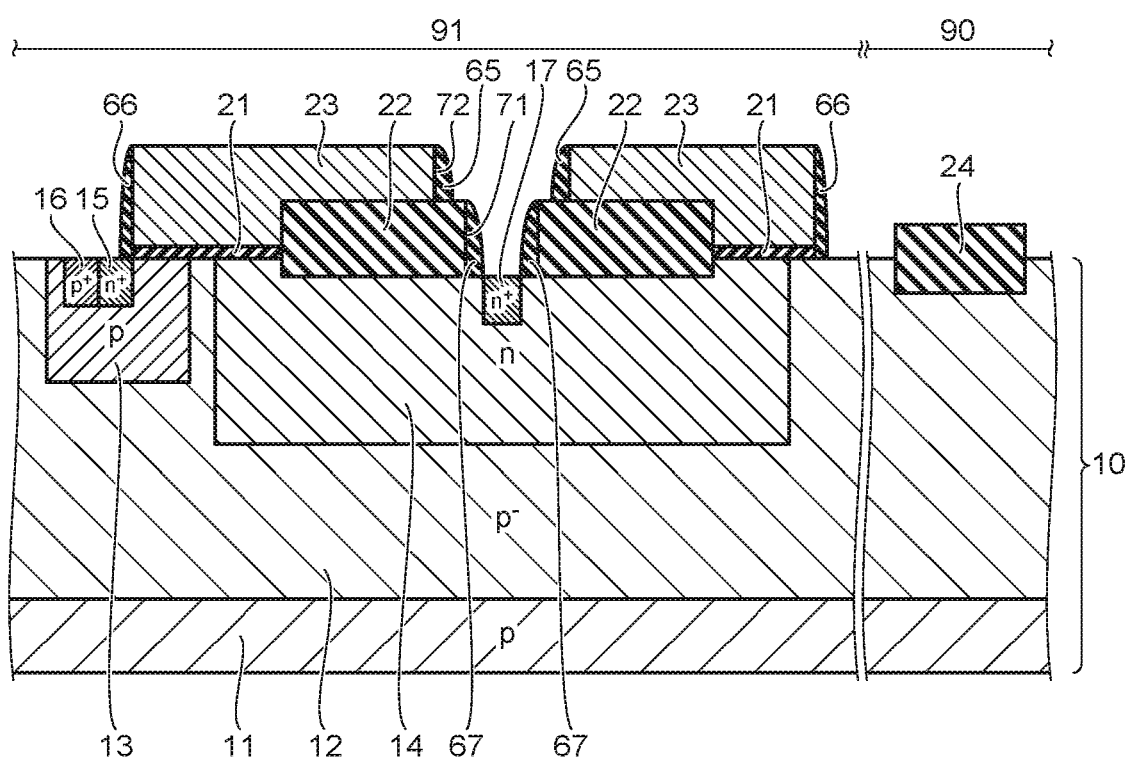

Continuing as shown in FIG. 13, the sidewall 65 is formed on the side surface of the gate electrode 23 on the drain side; the sidewall 66 is formed on the side surface of the gate electrode 23 on the source side; and the sidewall 67 is formed on the side surface of the through-hole 71. Then, a resist pattern (not illustrated) is formed; and an impurity that forms donors is ion-implanted using the resist pattern, the gate electrode 23, the insulating film 22, and the sidewall 67 as a mask. Thereby, the n$^+$-type drain layer 17 is formed in the upper layer portion of the n-type drift layer 14 in the region directly under the through-hole 71. Also, the n$^+$-type source layer 15 and the p$^+$-type contact layer 16 are formed by selectively ion-implanting impurities.

Then, as shown in FIG. 8, the inter-layer insulating film 30 is formed on the semiconductor substrate 10. Then, the source contact 31, the drain contact 32, and the gate contact are formed. The source contact 31 is connected to the n$^+$-type source layer 15 outside the insulating film 22. The lower portion of the drain contact 32 is disposed inside the through-hole 71 of the insulating film 22 and is connected to the n$^+$-type drain layer 17 via the through-hole 71. The gate contact is connected to the gate electrode 23. Thus, the semiconductor device 2 according to the embodiment is manufactured.

Effects of the embodiment will now be described.

According to the embodiment, in the process shown in FIG. 11, the entire side surface of the insulating film 22 is covered with the gate electrode 23 when forming the gate electrode 23 by patterning the polysilicon film 59. Therefore, the polysilicon film 59 that does not form the gate electrode 23 does not remain on the side surface of the insulating film 22. Subsequently, the through-hole 71 is formed in the insulating film 22 in the process shown in FIG. 12. Because the through-hole 71 is formed after patterning the polysilicon film 59, the polysilicon film 59 does not remain on the side surface of the through-hole 71.

Thereby, when forming the sidewall 67 on the side surface of the through-hole 71 of the insulating film 22, the position of the sidewall 67 does not shift due to effects of the polysilicon film 59 remaining on the side surface of the insulating film 22. As a result, the drain contact 32 can be formed with high precision.

Otherwise, the configuration, the manufacturing method, and the effects of the embodiment are similar to those of the first embodiment.

Although an example is shown in the embodiments and the modifications of the embodiments described above in which an n-channel DMOS is formed, this is not limited thereto; and a p-channel DMOS may be formed. The transistor that is formed is not limited to a DMOS and includes MOSFETs in general such as, for example, a LDMOS (Laterally Diffused MOS), a DEMOS (Drain Extended Metal Oxide Semiconductor; Drain Extended MOS), etc. The material of the gate electrode 23 is not limited to polysilicon and may be a metal. The first embodiment and the modifications of the first embodiment may be performed in combination with the second embodiment.

According to the embodiments described above, a semiconductor device and a method for manufacturing the semiconductor device can be realized in which the ON-resistance is low and the reliability is high.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
a semiconductor portion;
a first insulating film provided on the semiconductor portion;
a second insulating film contacting the first insulating film, being provided on the semiconductor portion, and being thicker than the first insulating film, a through-hole being formed in the second insulating film;
a first contact having a lower end connected to the semiconductor portion;
a second contact having a lower portion disposed inside the through-hole and a lower end connected to the semiconductor portion;
a gate electrode positioned between the first contact and the second contact, provided on the first insulating film, and provided on a portion of the second insulating film other than the through-hole; and
a third insulating film having at least a lower portion provided inside the semiconductor portion,
a lower surface of the third insulating film being positioned lower than a lower surface of the second insulating film.

2. The device according to claim 1, wherein an angle between an upper surface of the second insulating film and a first side surface of the second insulating film is a right angle or an acute angle, the first side surface being at the first insulating film side of the second insulating film.

3. The device according to claim 1, wherein
a second side surface of the second insulating film opposite to the first insulating film connects an upper surface and the lower surface of the second insulating film,
the upper surface of the second insulating film is shorter than the lower surface of the second insulating film in a direction from the first insulating film to the second insulating film,
the second side surface includes
a first surface connected to the upper surface, and
a second surface connected to the lower surface.

4. The device according to claim 1, wherein
the semiconductor portion includes:
a first semiconductor layer;
a second semiconductor layer provided in a portion on the first semiconductor layer, the second semiconductor layer being of a first conductivity type;
a third semiconductor layer connected to the first contact and provided in a portion on the second semiconductor layer, the third semiconductor layer being of a second conductivity type; and
a fourth semiconductor layer connected to the second contact and provided in an other portion on the first semiconductor layer, the fourth semiconductor layer being of the second conductivity type.

5. The device according to claim 1, wherein a thickness of a portion of the second insulating film disposed higher than the semiconductor portion is thicker than a thickness of a portion of the second insulating film disposed inside the semiconductor portion.

6. The device according to claim 1, wherein an upper surface of the third insulating film is coplanar with an upper surface of the second insulating film or is positioned lower than the upper surface of the second insulating film.

7. A semiconductor device, comprising:
a semiconductor portion;
a first insulating film provided on the semiconductor portion;
a second insulating film contacting the first insulating film, being provided on the semiconductor portion, and being thicker than the first insulating film, an angle between an upper surface of the second insulating film and a first side surface of the second insulating film being a right angle or an acute angle, the first side surface being at the first insulating film side of the second insulating film, an angle between the upper surface and a second side surface of the second insulating film being an obtuse angle, the second side surface being on a side of the second insulating film opposite to the first insulating film side;
a gate electrode provided on the first insulating film and on a portion of the second insulating film; and
a third insulating film having at least a lower portion provided inside the semiconductor portion,
a lower surface of the third insulating film being positioned lower than a lower surface of the second insulating film.

8. The device according to claim 7, further comprising:
a first contact having a lower end connected to the semiconductor portion; and
a second contact having a lower end connected to the semiconductor portion,
the gate electrode being positioned between the first contact and the second contact,
the first insulating film being positioned between the first contact and the second insulating film,
the second insulating film being positioned between the second contact and the first insulating film.

9. The device according to claim 8, wherein
the semiconductor portion includes:
a first semiconductor layer;
a second semiconductor layer provided in a portion on the first semiconductor layer, the second semiconductor layer being of a first conductivity type;
a third semiconductor layer connected to the first contact and provided in a portion on the second semiconductor layer, the third semiconductor layer being of a second conductivity type; and
a fourth semiconductor layer connected to the second contact and provided in an other portion on the first semiconductor layer, the fourth semiconductor layer being of the second conductivity type.

10. The device according to claim 7, wherein a thickness of a portion of the second insulating film disposed higher than the semiconductor portion is thicker than a thickness of a portion of the second insulating film disposed inside the semiconductor portion.

11. The device according to claim 7, wherein an upper surface of the third insulating film is coplanar with an upper surface of the second insulating film or is positioned lower than the upper surface of the second insulating film.

12. The device according to claim 7, wherein
the second side surface connects the upper surface and the lower surface of the second insulating film,
the upper surface of the second insulating film is shorter than the lower surface of the second insulating film in a direction from the first insulating film to the second insulating film,
the second side surface includes
a first surface connected to the upper surface, and
a second surface connected to the lower surface.

* * * * *